United States Patent
Sano et al.

(10) Patent No.: US 9,972,401 B2
(45) Date of Patent: *May 15, 2018

(54) MULTI-PORT MEMORY, SEMICONDUCTOR DEVICE, AND MEMORY MACRO-CELL CAPABLE OF PERFORMING TEST IN A DISTRIBUTED STATE

(71) Applicant: Renesas Electronics Corporation, Tokyo (JP)

(72) Inventors: Toshiaki Sano, Tokyo (JP); Shunya Nagata, Tokyo (JP); Shinji Tanaka, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/606,562

(22) Filed: May 26, 2017

(65) Prior Publication Data
US 2017/0263333 A1 Sep. 14, 2017

Related U.S. Application Data

(63) Continuation of application No. 15/281,947, filed on Sep. 30, 2016, now Pat. No. 9,691,502.

(30) Foreign Application Priority Data

Oct. 23, 2015 (JP) ................................ 2015-208680

(51) Int. Cl.
*G11C 8/00* (2006.01)
*G11C 29/12* (2006.01)
(Continued)

(52) U.S. Cl.
CPC ............ *G11C 29/12* (2013.01); *G11C 7/1075* (2013.01); *G11C 8/10* (2013.01); *G11C 8/16* (2013.01);
(Continued)

(58) Field of Classification Search
CPC .......... G11C 7/1075; G11C 8/16; G11C 7/18; G11C 8/10; G11C 11/406;
(Continued)

(56) References Cited

U.S. PATENT DOCUMENTS

| 5,197,035 A | 3/1993 | Ito |
| 6,594,196 B2 | 7/2003 | Hsu et al. |

(Continued)

FOREIGN PATENT DOCUMENTS

| JP | 2008-299991 A | 12/2008 |
| JP | 2009-64532 A | 3/2009 |
| JP | 2010-80001 A | 4/2010 |

OTHER PUBLICATIONS

Yuichiro Ishii, et al, "A 28 nm Dual-Port SRAM Macro With Screening Circuitry Against Write-Read Disturb Failure Issues." IEEE Journal of Solid-State Circuits, U.S.A., Institute of Electrical and Electronics Engineers, Nov. 2011, pp. 2535-2544, vol. 46, No. 11.

*Primary Examiner* — Gene Auduong
(74) *Attorney, Agent, or Firm* — Sughrue Mion, PLLC

(57) ABSTRACT

A multi-port memory includes a memory cell, first and second word lines, first and second bit lines, first and second address terminals, and an address control circuit. The address control circuit controls the first and second word lines independently of each other on the basis of address signals that are respectively supplied to the first and second address terminals in a normal operation mode, and activates both of the first and second word lines that are coupled to the same memory cell on the basis of the address signal that is supplied to one of the first and second address terminals in a disturb test mode.

9 Claims, 14 Drawing Sheets

(51) Int. Cl.

| | | |
|---|---|---|
| *G11C 7/10* | (2006.01) | |
| *G11C 8/10* | (2006.01) | |
| *G11C 8/16* | (2006.01) | |
| *G11C 11/406* | (2006.01) | |
| *G11C 11/418* | (2006.01) | |
| *G11C 11/419* | (2006.01) | |
| *G11C 11/412* | (2006.01) | |
| *G11C 29/02* | (2006.01) | |
| *G11C 29/18* | (2006.01) | |

(52) U.S. Cl.
CPC .......... *G11C 11/406* (2013.01); *G11C 11/412* (2013.01); *G11C 11/418* (2013.01); *G11C 11/419* (2013.01); *G11C 29/025* (2013.01); *G11C 29/12015* (2013.01); *G11C 29/18* (2013.01); *G11C 2029/1202* (2013.01)

(58) Field of Classification Search
CPC .......... G11C 2207/107; G11C 11/405; G11C 11/10603; G11C 11/409; G11C 7/1039; G11C 7/1051; G11C 7/22; G11C 11/4093; G11C 8/18
USPC ............ 365/230.05, 230.06, 189.04, 189.05, 365/230.09, 230.03, 154, 156
See application file for complete search history.

(56) References Cited

U.S. PATENT DOCUMENTS

| | | |
|---|---|---|
| 7,742,350 B2 | 6/2010 | Yamaguchi et al. |
| 7,894,296 B2 | 2/2011 | Lee et al. |
| 9,691,502 B2 * | 6/2017 | Sano ..................... G11C 11/412 |
| 2002/0078311 A1 | 6/2002 | Matsuzaki et al. |
| 2008/0298148 A1 | 12/2008 | Nagata |

* cited by examiner

FIG. 5

| EXTERNAL INPUT | | | | | | | ADDRESS SELECTION | | CLOCK SELECTION | | TEST | 0: TEST 1: DISTURB | | OPERATION |
|---|---|---|---|---|---|---|---|---|---|---|---|---|---|---|
| SELT | TME | TCLK | CLKA | CLKB | CEA | CEB | SAA | SAB | SCKA | SCKB | TEST | IFA | IFB | |
| 1 | 0 | ↑ | - | - | 1 | 1 | AA | AB | TCLK | TCLK | 0 | 0 | 0 | NORMAL MEMORY TEST BY TCLK |
| 1 | 0 | ↑ | - | - | 0 | 1 | AA | AB | 0 | TCLK | 0 | 0 | 0 | |
| 1 | 0 | ↑ | - | - | 1 | 0 | AA | AB | TCLK | 0 | 0 | 0 | 0 | |
| 1 | 0 | ↑ | - | - | 0 | 0 | AA | AB | 0 | 0 | 0 | 0 | 0 | |
| 1 | 1 | ↑ | - | - | 1 | 1 | AA | AB | TCLK | TCLK | 1 | 0 | 0 | UNDISTURBED OPERATION |
| 1 | 1 | ↑ | - | - | 0 | 1 | AB | AB | TCLK | TCLK | 1 | 1 | 0 | A: DISTURB, B: TEST |
| 1 | 1 | ↑ | - | - | 1 | 0 | AA | AA | TCLK | TCLK | 1 | 0 | 1 | A: TEST, B: DISTURB |
| 1 | 1 | ↑ | - | - | 0 | 0 | AB | AA | 0 | 0 | 1 | 1 | 1 | NOP |
| 0 | 0 | - | ↑ | ↑ | 1 | 1 | AA | AB | CLKA | CLKB | 0 | 0 | 0 | NORMAL OPERATION |
| 0 | 0 | - | ↑ | ↑ | 0 | 1 | AA | AB | 0 | CLKB | 0 | 0 | 0 | |
| 0 | 0 | - | ↑ | ↑ | 1 | 0 | AA | AB | CLKA | 0 | 0 | 0 | 0 | |
| 0 | 1 | - | ↑ | ↑ | 1 | 1 | AA | AB | CLKA | CLKB | 0 | 0 | 0 | |
| 0 | 1 | - | ↑ | ↑ | 0 | 1 | AA | AB | 0 | CLKB | 0 | 0 | 0 | |
| 0 | 1 | - | ↑ | ↑ | 1 | 0 | AA | AB | CLKA | 0 | 0 | 0 | 0 | |
| 0 | 1 | - | ↑ | ↑ | 0 | 0 | AA | AB | 0 | 0 | 0 | 0 | 0 | |

FIG. 8

| EXTERNAL INPUT | | | | | | | PRE-DECODE SIGNAL SELECTION | | CLOCK SELECTION | | TEST | 0: TEST 1: DISTURB | | OPERATION |
|---|---|---|---|---|---|---|---|---|---|---|---|---|---|---|
| SELT | TME | TCLK | CLKA | CLKB | CEA | CEB | PAA | PAB | SCKA | SCKB | TEST | IFA | IFB | |
| 1 | 0 | ↑ | - | - | 1 | 1 | DAA | DAB | TCLK | TCLK | 0 | 0 | 0 | NORMAL MEMORY TEST BY TCLK |
| 1 | 0 | ↑ | - | - | 0 | 1 | DAA | DAB | TCLK | 0 | 0 | 0 | 0 | |
| 1 | 0 | ↑ | - | - | 1 | 0 | DAA | DAB | 0 | TCLK | 0 | 0 | 0 | |
| 1 | 0 | ↑ | - | - | 0 | 0 | DAA | DAB | 0 | 0 | 0 | 0 | 0 | |
| 1 | 1 | ↑ | - | - | 1 | 1 | DAA | DAB | TCLK | TCLK | 1 | 0 | 0 | UNDISTURBED OPERATION |
| 1 | 1 | ↑ | - | - | 0 | 1 | DAB | DAB | TCLK | TCLK | 1 | 1 | 0 | A: DISTURB, B: TEST |
| 1 | 1 | ↑ | - | - | 1 | 0 | DAA | DAA | TCLK | TCLK | 1 | 0 | 1 | A: TEST, B: DISTURB |
| 1 | 1 | ↑ | - | - | 0 | 0 | DAB | DAA | 0 | 0 | 1 | 1 | 1 | NOP |
| 0 | 0 | - | ↑ | ↑ | 1 | 1 | DAA | DAB | CLKA | CLKB | 0 | 0 | 0 | NORMAL OPERATION |
| 0 | 0 | - | ↑ | ↑ | 0 | 1 | DAA | DAB | 0 | CLKB | 0 | 0 | 0 | |
| 0 | 0 | - | ↑ | ↑ | 1 | 0 | DAA | DAB | CLKA | 0 | 0 | 0 | 0 | |
| 0 | 0 | - | ↑ | ↑ | 0 | 0 | DAA | DAB | 0 | 0 | 0 | 0 | 0 | |
| 0 | 1 | - | ↑ | ↑ | 1 | 1 | DAA | DAB | CLKA | CLKB | 0 | 0 | 0 | |
| 0 | 1 | - | ↑ | ↑ | 0 | 1 | DAA | DAB | 0 | CLKB | 0 | 0 | 0 | |
| 0 | 1 | - | ↑ | ↑ | 1 | 0 | DAA | DAB | CLKA | 0 | 0 | 0 | 0 | |
| 0 | 1 | - | ↑ | ↑ | 0 | 0 | DAA | DAB | 0 | 0 | 0 | 0 | 0 | |

FIG. 10

| EXTERNAL INPUT | | | | | | PRE-DECODE SIGNAL SELECTION | | CLOCK SELECTION | | 0: TEST 1: DISTURB | | | OPERATION |
|---|---|---|---|---|---|---|---|---|---|---|---|---|---|
| SELT | TME | TCLK | CLKA | CLKB | CEA | CEB | IAA | IAB | SCKA | SCKB | TEST | IFA | IFB | |
| 1 | 0 | ↑ | - | - | 1 | 1 | DAA | DAB | TCLK | TCLK | 0 | 0 | 0 | NORMAL MEMORY TEST BY TCLK |
| 1 | 0 | ↑ | - | - | 0 | 1 | DAA | DAB | TCLK | 0 | 0 | 0 | 0 | |
| 1 | 0 | ↑ | - | - | 1 | 0 | DAA | DAB | 0 | TCLK | 0 | 0 | 0 | |
| 1 | 0 | ↑ | - | - | 0 | 0 | DAA | DAB | 0 | 0 | 0 | 0 | 0 | |
| 1 | 1 | ↑ | - | - | 1 | 1 | DAA | DAB | TCLK | TCLK | 1 | 0 | 0 | UNDISTURBED OPERATION |
| 1 | 1 | ↑ | - | - | 0 | 1 | 1 | DAB | TCLK | TCLK | 1 | 1 | 0 | A: DISTURB, B: TEST |
| 1 | 1 | ↑ | - | - | 1 | 0 | DAA | 1 | TCLK | TCLK | 1 | 0 | 1 | A: TEST, B: DISTURB |
| 1 | 1 | ↑ | - | - | 0 | 0 | 1 | 1 | 0 | 0 | 1 | 1 | 1 | NOP |
| 0 | 0 | - | ↑ | ↑ | 1 | 1 | DAA | DAB | CLKA | CLKB | 0 | 0 | 0 | NORMAL OPERATION |
| 0 | 0 | - | ↑ | ↑ | 0 | 1 | DAA | DAB | 0 | CLKB | 0 | 0 | 0 | |
| 0 | 0 | - | ↑ | ↑ | 1 | 0 | DAA | DAB | CLKA | 0 | 0 | 0 | 0 | |
| 0 | 0 | - | ↑ | ↑ | 0 | 0 | DAA | DAB | 0 | 0 | 0 | 0 | 0 | |
| 0 | 1 | - | ↑ | ↑ | 1 | 1 | DAA | DAB | CLKA | CLKB | 0 | 0 | 0 | |
| 0 | 1 | - | ↑ | ↑ | 0 | 1 | DAA | DAB | 0 | CLKB | 0 | 0 | 0 | |
| 0 | 1 | - | ↑ | ↑ | 1 | 0 | DAA | DAB | CLKA | 0 | 0 | 0 | 0 | |
| 0 | 1 | - | ↑ | ↑ | 0 | 0 | DAA | DAB | 0 | 0 | 0 | 0 | 0 | |

FIG. 12

| EXTERNAL INPUT | | | | | | ADDRESS SELECTION | | CLOCK SELECTION | | TEST | 0: TEST 1: DISTURB | | OPERATION |
|---|---|---|---|---|---|---|---|---|---|---|---|---|---|
| TMEA | TMEB | CLKA | CLKB | CEA | CEB | SAA | SAB | SCKA | SCKB | TEST | IFA | IFB | |
| 1 | - | ↑ | ↑ | 1 | 1 | AA | AB | CLKA | CLKB | 1 | 0 | 0 | UNDISTURBED OPERATION |
| 1 | - | ↑ | ↑ | 0 | 1 | AB | AB | CLKB | CLKB | 1 | 1 | 0 | A: DISTURB, B: TEST |
| 1 | - | ↑ | ↑ | 1 | 0 | AA | AA | CLKA | CLKA | 1 | 0 | 1 | A: TEST, B: DISTURB |
| 1 | - | ↑ | ↑ | 0 | 0 | AB | AA | 0 | 0 | 1 | 1 | 1 | NOP |
| - | 1 | ↑ | ↑ | 1 | 1 | AA | AB | CLKA | CLKB | 1 | 0 | 0 | UNDISTURBED OPERATION |
| - | 1 | ↑ | ↑ | 0 | 1 | AB | AB | CLKB | CLKB | 1 | 1 | 0 | A: DISTURB, B: TEST |
| - | 1 | ↑ | ↑ | 1 | 0 | AA | AA | CLKA | CLKA | 1 | 0 | 1 | A: TEST, B: DISTURB |
| - | 1 | ↑ | ↑ | 0 | 0 | AB | AA | 0 | 0 | 1 | 1 | 1 | NOP |
| 0 | 0 | ↑ | ↑ | 1 | 1 | AA | AB | CLKA | CLKB | 0 | 0 | 0 | NORMAL OPERATION |
| 0 | 0 | ↑ | ↑ | 0 | 1 | AA | AB | 0 | CLKB | 0 | 0 | 0 | |
| 0 | 0 | ↑ | ↑ | 1 | 0 | AA | AB | CLKA | 0 | 0 | 0 | 0 | |
| 0 | 0 | ↑ | ↑ | 0 | 0 | AA | AB | 0 | 0 | 0 | 0 | 0 | |

MULTI-PORT MEMORY, SEMICONDUCTOR DEVICE, AND MEMORY MACRO-CELL CAPABLE OF PERFORMING TEST IN A DISTRIBUTED STATE

CROSS-REFERENCE TO RELATED APPLICATIONS

This is a continuation of U.S. application Ser. No. 15/281,947 filed Sep. 30, 2016, which claims priority from Japanese Patent Application No. 2015-208680 filed on Oct. 23, 2015, the disclosures of which are incorporated by reference herein in their entirety.

BACKGROUND

The present invention relates to a multi-port memory, a semiconductor device that the multi-port memory has been loaded, and a memory macro-cell that is used as a library in an LSI (Large Scale Integrated circuit) design support system that designs the semiconductor device and in particular relates to the multi-port memory on which a test is favorably performed in a disturbed state and the semiconductor device and the memory macro-cell that are favorably utilized in the test that is performed on the multi-port memory concerned in the disturbed state.

In a test performed on a dual-port SRAM (Static Random Access Memory) (hereinafter, abbreviated as DP-SRAM), it is known that the so-called disturbed state where the same memory cell, that is, one memory cell is accessed from the both ports is one of the worst states that are reduced in operation timing margin. The disturbed state means a state where when a plurality of word lines that are coupled to the same memory cell have been activated, a read margin and/or a write margin from a port that has used one word line is/are more deteriorated than the margin(s) when the other word line is not activated. A port that is a test object will be called a test port and a port that activates the other word line will be called a disturb port.

In Japanese Unexamined Patent Application Publication No. 2010-80001 and Yuichiro Ishii, et al, "A 28 nm Dual-Port SRAM Macro With Screening Circuitry Against Write-Read Disturb Failure Issues", IEEE J. Solid-State Circuits, U.S.A., Institute of Electrical and Electronics Engineers, November 2011, Vol. 46, No. 11, pp. 2535-2544, there are disclosed circuits of the type configured to adjust timings that the word lines on the disturb port side and the test port side are activated in order to appropriately give the disturbed state. When the word line on the disturb port side is activated and the disturbed state has reached its saturation level, the word line on the test port side is activated.

In Japanese Unexamined Patent Application Publication No. 2008-299991, there is disclosed a DP-SRAM that adjusts the timings that the word lines of two ports are activated on the basis of a delay control signal.

In Japanese Unexamined Patent Application Publication No. 2009-64532, a DP-SRAM to which a BIST (Built In Self Test) circuit has been coupled is disclosed. When a test mode signal that instructs simultaneous accessing from two ports is input, an address pattern generation circuit in the BIST circuit generates address signals AA[0:a] and AB[0:a] with which both of A and B ports select the same memory cell and supplies the address signals so generated to address input terminals of the A and B ports of the DP-SRAM.

SUMMARY

As a result of examinations that the inventors et al. of the present invention have made on Japanese Unexamined Patent Application Publication Nos. 2010-80001, 2008-299991 and 2009-64532 and Yuichiro Ishii, et al, "A 28 nm Dual-Port SRAM Macro With Screening Circuitry Against Write-Read Disturb Failure Issues", IEEE J. Solid-State Circuits, U.S.A., Institute of Electrical and Electronics Engineers, November 2011, Vol. 46, No. 11, pp. 2535-2544, it was found that there are new matters to be solved as follows.

Although in Japanese Unexamined Patent Application Publication Nos. 2010-80001 and 2008-299991 and Yuichiro Ishii, et al, "A 28 nm Dual-Port SRAM Macro With Screening Circuitry Against Write-Read Disturb Failure Issues", IEEE J. Solid-State Circuits, U.S.A., Institute of Electrical and Electronics Engineers, November 2011, Vol. 46, No. 11, pp. 2535-2544, a circuit mechanism that adjusts the timings that the word lines are activated is disclosed, nothing is described in regard to an address signal inputting method adapted to activate the plurality of word lines that are coupled to one memory cell. In general, the multi-port memory is configured so as to make it possible for a plurality of access subjects to access to the plurality of ports independently of one another. For example, a plurality of CPUs (Central processing Units) are coupled to mutually different ports and access to the multi-port memory independently of one another and/or asynchronously with one another.

Therefore, in order to implement the disturbed stare in the multi-port memory, it is requested to input an address signal adapted to activate the plurality of word lines that are coupled to one memory cell into the plurality of ports simultaneously, in addition to such adjustment of the timings that the word lines are activated as that described, for example, in Japanese Unexamined Patent Application Publication Nos. 2010-80001 and 2008-299991 and Yuichiro Ishii, et al, "A 28 nm Dual-Port SRAM Macro With Screening Circuitry Against Write-Read Disturb Failure Issues", IEEE J. Solid-State Circuits, U.S.A., Institute of Electrical and Electronics Engineers, November 2011, Vol. 46, No. 11, pp. 2535-2544. However, here "simultaneously" means to contribute to the same access cycle and does not mean the same time of day that is strict physically and mathematically.

Since, in many cases, the plurality of word lines that are coupled to one memory cell are activated by using the same address value, it is requested to input the same address value into address terminals of the plurality of ports simultaneously. However, since in a normal operation, the plurality of access subjects that access to the plurality of ports operate independently of one another as mentioned above, it is difficult to input the same address value into the address terminals of the plurality of ports simultaneously. For example, it is difficult to configure such that the plurality of CPUs that operate asynchronously with one another and independently of one another issue the same address simultaneously (in the same access cycle).

On the other hand, it is allowed to input the same address into the plurality of ports simultaneously by coupling such a BIST as that disclosed, for example, in Japanese Unexamined Patent Application Publication No. 2009-64532 to the multi-port memory. However, since the BIST itself is configured by standard cells, an overhead that is put on the memory in terms of a chip area is large. In particular, the overhead that is put on a memory of a small memory capacity is increased.

It is highly profitable to provide a multi-port memory that is capable of forming the disturbed state by one access subject that is coupled to one port and operates independently with no utilization of the BIST circuit.

Although, in the following, measures for solving subject matters as mentioned above will be described, other subject matters and novel features of the present invention will become apparent from the description of the present specification and the appended drawings.

A multi-port memory according to one embodiment will be described as follows.

That is, the multi-port memory according to one embodiment includes a memory cell, first and second word lines, first and second bit lines, first and second address terminals, an address control circuit and so forth and has first and second operation modes. The multi-port memory is configured as follows.

The first word line is activated and thereby the memory cell is electrically coupled to the first bit line, and the second word line is activated and thereby the memory cell is electrically coupled to the second bit line respectively. That is, the first and second word lines are two word lines that are capable of selecting the same memory cell. In the first operation mode, the address control circuit performs control as to whether the first word line is activated on the basis of a first address signal that is input into the first address terminal and also performs control as to whether the second word line is activated on the basis of a second address signal that is input into the second address terminal. That is, the first word line and the second word line are controlled independently of each other on the basis of the first address signal that is input into the first address terminal and the second address signal that is input into the second address terminal. In the second operation mode, the address control circuit performs control as to whether the first word line and the second word line that are coupled to the same memory cell are activated on the basis of the first address signal that is input into the first address terminal.

Advantageous effects obtained by the above mentioned one embodiment will be briefly described as follows.

That is, in the second operation mode, it is possible to control the memory to the disturbed state simply by inputting the address signal through one address terminal, and the test in the disturbed state becomes possible simply by controlling the access subject that is coupled to one of the ports of the multi-port memory.

BRIEF DESCRIPTION OF THE DRAWINGS

FIG. 5 is an explanatory diagram of one example of an operation of the DP-SRAM according to the second embodiment indicated in the form of a true value table.

FIG. 8 is an explanatory diagram of one example of an operation of the DP-SRAM according to the third embodiment indicated in the form of a true value table.

FIG. 10 is an explanatory diagram of one example of an operation of the DP-SRAM according to the fourth embodiment indicated in the form of a true value table.

FIG. 12 is an explanatory diagram of one example of an operation of the DP-SRAM according to the fifth embodiment indicated in the form of a true value table.

DETAILED DESCRIPTION

Preferred embodiments of the present invention will be described in detail with reference to the appended drawings. Incidentally, in all drawings for illustrating the embodiments of the present invention, the same numerals are assigned to elements having the same functions and repetitive description thereof is omitted. A diagonal line drawn on a signal line in the block diagram and the configurational diagram is a so-called vector representation that means that the signal line concerned is configured by a plurality of wirings. However, it is also possible to configure the signal line that is not represented by the vector by the plurality of wirings. On the other hand, there are cases where the signal line is implemented by one wiring depending on the specification even when it is represented by the vector.

First Embodiment

Figure 1:
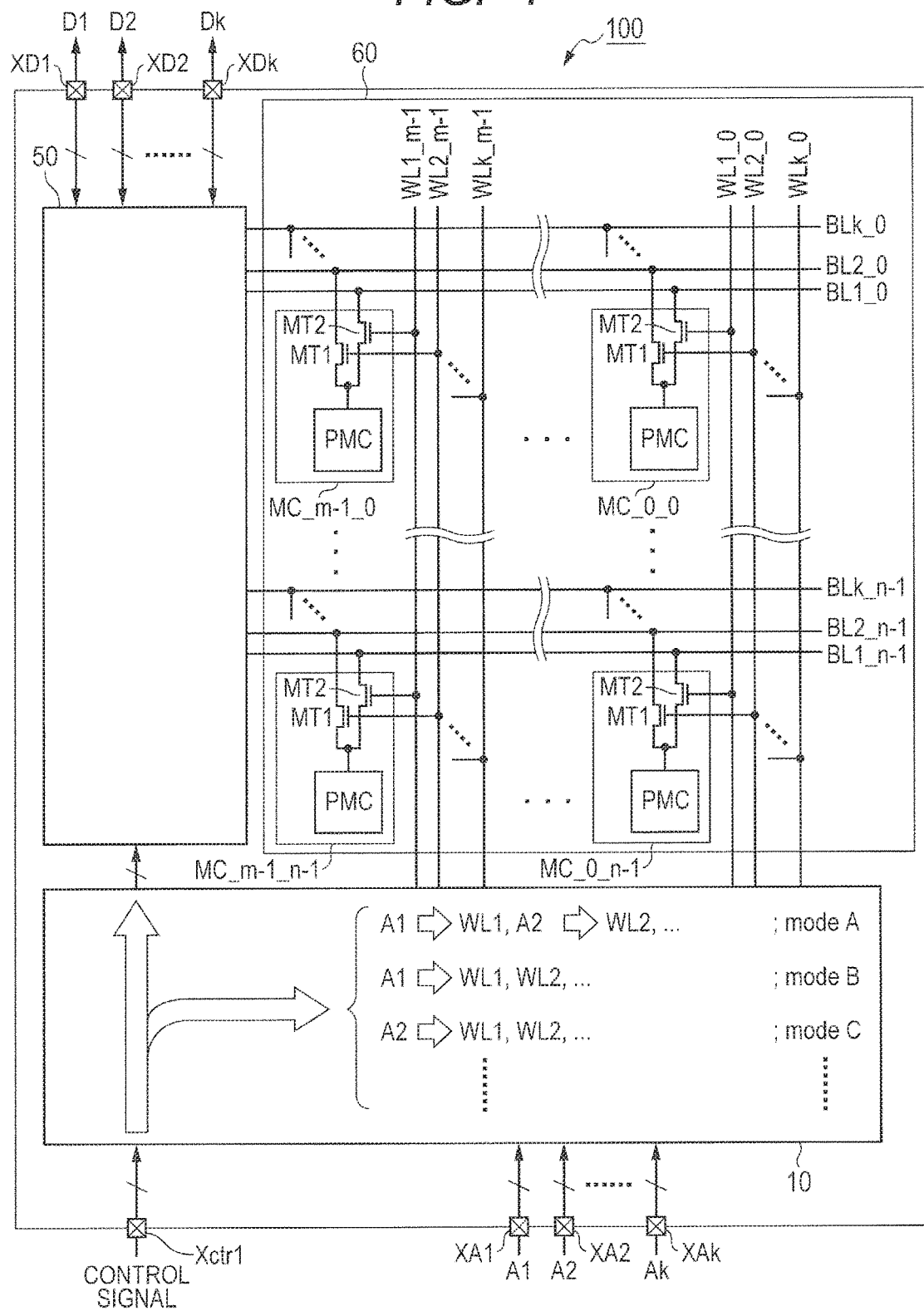
FIG. 1 is a block diagram schematically illustrating one example of a configuration of a multi-port memory according to a first embodiment.

FIG. 1 is a block diagram schematically illustrating one example of a configuration of a multi-port memory 100 according to the first embodiment. The multi-port memory 100 illustrated in FIG. 1 is an n-bit line, m-word line multi-port memory that includes k ports (k, n and m each is a positive integer). The multi-port memory 100 includes a memory cell array 60, an input/output circuit 50, an address control circuit 10, address terminals XA1, XA2 to XAk, a control signal terminal Xctrl and so forth. The memory cell array 60 is configured by memory cells MC_0_0 to MC_0_n−1, MC_m−1_0 to MC_m−1_n−1 that are arrayed in a matrix of n rows×m columns. Each memory cell MC is configured by a primitive memory cell PMC that stores one-bit information and a plurality of transfer gates MT1, MT2, . . . (only MT1 and MT2 are illustrated) that correspond to the respective ports.

On the memory cell array 60, m×k word lines WL1_0 to WL1_m−1, WL2_0 to WL2_m−1, . . . , WLk_0 to WLk_m−1 that correspond to the respective ports are wired and n×k bit lines BL1_0 to BL1_n−1, BL2_0 to BL2_n−1, . . . , BLk_0 to BLk_n−1 are wired in a direction orthogonal to the plurality of word lines. The memory cell is arranged on a spot where the word line concerned and the bit line concerned mutually intersect. The first word lines WL1_0 to WL1_m−1 that correspond to the first port are activated correspondingly to each port and thereby the memory cells MC_0_0 to MC_0_n−1 that are coupled to these first word lines are electrically coupled to the first bit lines BL1_0 to BL1_n−1 respectively. Likewise, the second word lines WL2_0 to WL2_m−1 that correspond to the second port are activated and thereby the memory cells NC_0_0 to MC_0_n−1 that are coupled to these second word lines are electrically coupled to the second bit lines BL2_0 to BL2_n−1 respectively. Further, similarly to the above, the k-th word lines WLk_0 to WLk_m−1 that correspond to the k-th port are activated and thereby the memory cells MC_0_0 to MC_0_n−1 that are coupled to the k-th word lines are electrically coupled to the k-th bit lines BLk_0 to BLk_n−1 respectively. The same is true of the word lines corresponding to the other respective ports.

Address signals A1, A2, . . . , Ak are input into the address control circuit 10 through address terminals XA1, XA2, . . . , XAk that correspond to the respective ports and various control signals are input into the address control circuit 10 through the control signal terminal Xctrl. The address control circuit 10 activates the word lines WL1_0 to WL1_m−1, WL2_0 to WL2_m−1, . . . , WLk_0 to WLk_m−1 on the basis of the value of an address signal that has been selected with the input control signal and controls the input/output circuit 50. The input/output circuit 50 performs inputting/outputting of data D1, D2, . . . , Dk between its own self and each of data input/output terminals XD1, XD2, . . . , XDk that correspond to the respective ports. The input/output circuit 50 drives the corresponding bit line in order to read data out of the memory cell array 60 onto the bit line concerned and outputs the data to the corresponding data input/output terminal or in order to write the data that has been input through the data input/output terminal into the memory cell corresponding to each bit line of the selected word line in the memory cell array 60 on the basis of various control signals input through the control signal terminal Xctrl.

Though not limited in particular, the multi-port memory 100 is loaded on an LSI that is formed on a single semiconductor substrate such as silicon and so forth by using, for example, a well-known CMOSFET (Complementary Metal-Oxide-Semiconductor Field Effect Transistor) semiconductor manufacturing technology. In this case, it is possible to provide circuit information, layout information, and design information (such as performance and so forth that would be determined depending on the circuit, the layout and so forth) of the multi-port memory 100 as a memory macro-cell that is included in the library of the LSI design support system. This point will be described in detail in a sixth embodiment.

The multi-port memory 100 according to the first embodiment has a plurality of operation modes including first and second operation modes (modeA, modeB).

The first operation mode modeA is, for example, a normal operation mode, and the address control circuit 10 performs control that is independent port by port in this operation mode. That is, the address control circuit 10 performs control as to whether the word line of the corresponding port is activated on the basis of the address signal that is input through the address terminal corresponding to each port. For example, the address control circuit 10 performs control so as to activate one of the word lines WL1_0 to WL1_m−1 that correspond to the first port on the basis of the address signal A1 that is input into the address terminal XA1 and so as to activate one of the word lines WL2_0 to WL2_m−1 that correspond to the second port on the basis of the address signal A2 that is input into the address terminal XA2.

The second operation mode modeB is an operation mode for a memory test performed, for example, in the disturbed state, and the address control circuit 10 performs control so as to activate the word lines of other ports that are coupled to the memory cell of the test object port. The disturbed state is established by activating the word lines that are coupled to the same memory cell as the above and correspond to other ports in response to an access from the test object port to the memory cell concerned. That is, the address control circuit 10 performs control as to whether the word line of the test object port concerned is activated on the basis of the address signal that is input through the address terminal corresponding to the test object port and also performs control as to whether the word line of the disturb side port is activated. For example, in the second operation mode modeB, the address control circuit 10 performs control so as to activate one of the word lines WL1_0 to WL1_m−1 corresponding to the first port and so as to activate one of the word lines WL2_0 to WL2_m−1 that are coupled to the same memory cell as the above and correspond to the second port on the basis of the address signal A1 that is input into the address terminal XA1.

Thereby, in the second operation mode modeB, it becomes possible to control the memory to the disturbed state simply by inputting the address signal through the address terminal of one port and it becomes possible to perform a memory test in the disturbed state simply by controlling the access subject that is coupled to one of the ports of the multi-port memory.

Further, a third operation mode modeC may be included. The third operation mode is also the operation mode for performing the memory test in the disturbed state. In the third operation mode modeC, the address control circuit 10 sets a port that is different from the test objet port in the second operation mode modeB as a test object port and performs control so as to activate the word lines that are coupled to the memory cell concerned and correspond to other ports. For example, in the third operation mode modeC, the address control circuit 10 performs control so as to activate one of the word lines WL1_0 to WL1_m−1 that correspond to the first port and so as to activate one of the word lines WL2_0 to WL2_m−1 that are coupled to the same memory cell as the above and correspond to the second port on the basis of the address signal A2 that is input into the address terminal XA2. Thereby, the access from the second port is set as a test object and the first port functions as a disturb-side port.

In the multi-port memory of the type that at least three ports are included, at least one port functions as the disturb side port for one test object port and thereby it becomes possible to perform the memory test in the disturbed state. In a multi-port memory of the specification that operations of all ports are performed independently of one another, when the word lines of all of the ports other than the test object port are activated, it results in the worst disturbed state. In such a case, the address control circuit 10 activates the word lines that are coupled to the same memory cell as the above and correspond to other ports on the basis of the address of the test object port. On the other hand, in a multi-port memory of the type that some restrictions are imposed on simultaneous accessing between/among the ports, the operation mode may be defined so as to establish the worst disturbed state within the range of the restrictions and the address control circuit 10 that copes with this situation may be installed.

The configuration that has been described in the first embodiment with reference to the drawings is merely one example. The number k of the ports is optional on condition that at least two ports are included. In addition, the number m of the word lines and the number n of the bit lines are also optional. It is not necessarily requested for each port to have both of writing and reading functions and the functions may be optionally defined port by port. In addition, the bit line may be of a complementary configuration that one-bit information is transmitted through two signal wirings of positive logic and negative logic ones. In this case, a buffer transistor that amplifies a read-out signal may be further included in the memory cell that is coupled to the bit lines that correspond to a read-only port. Further, the type of the memory cell is optional regardless of the volatile type and the nonvolatile type. The memory cell may be an SRAM, a DRAM (Dynamic Random Access Memory), an electrically rewritable or not-rewritable ROM (Read Only Memory) and so forth. In the multi-port memories, the multi-port memory of the type that the number k of ports is two (the port number k=2) and the memory is configured by the SRAM is particularly called a dual-port SRAM (DP-SRAM).

In each of the following second to fifth embodiments, although detailed embodiments of the DP-SRAM will be described, it is possible to expand it to a multi-port memory that the number k of the ports is at least three or it is also possible to optionally change it to a memory of the type other than the SRAM.

Second Embodiment

Figure 2:
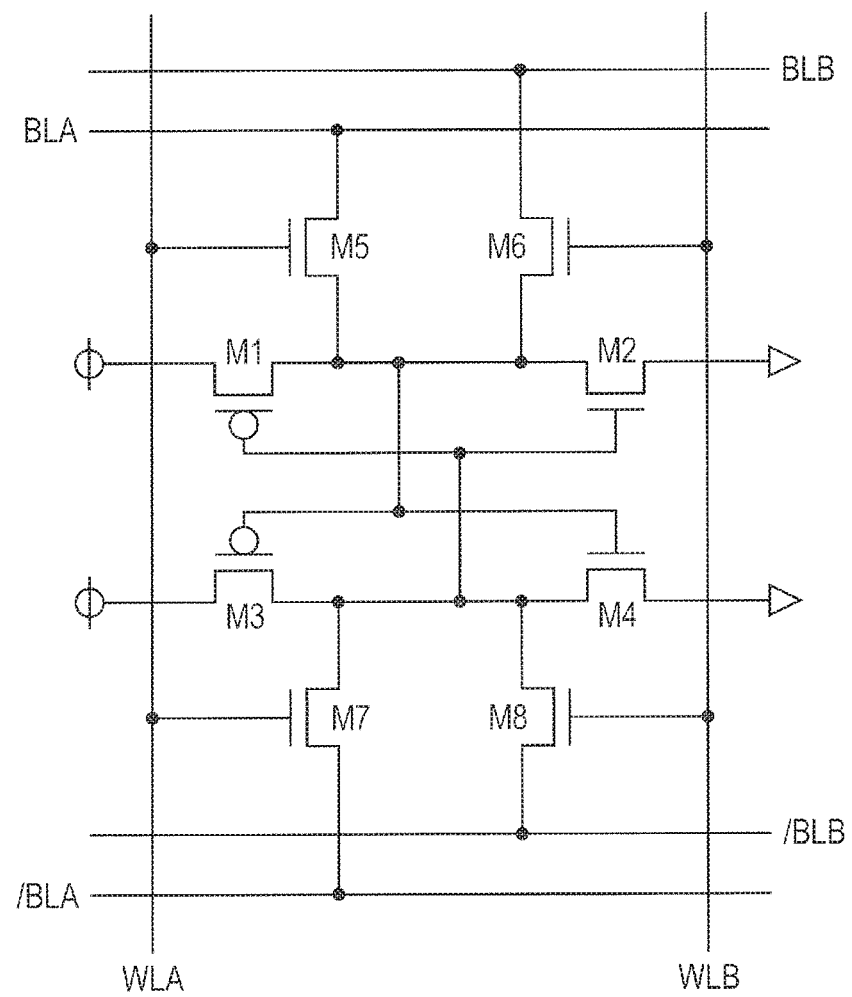
FIG. 2 is a circuit diagram illustrating one example of a configuration of a memory cell of a DP-SRAM that is one example of the multi-port memory.

FIG. 2 is a circuit diagram illustrating one example of a configuration of a memory cell MC of a DP-SRAM that is one example of the multi-port memory. Description will be made with two ports being called an "A port" and a "B port". The memory cell is configured by eight MOSFETs by adding two MOSFETs that function as transfer gates in order to configure a typical memory cell that includes six MOS-SRAMs as a dual-port memory. Two inverters that are configured each by two MOSFETs (M1 and M2, and M3 and M4) are installed between a power source and a ground potential source with mutual output terminals being coupled to mating input terminals so as to configure one primitive memory element (corresponding to PMC in FIG. 1,). Two transfer gates that are configured each by two transfer gates M5 and M6, and M7 and M8 are coupled to two memory nodes of the memory element. A word line WLA and complementary bit lines BLA and/BLA that correspond to the A port and a word line WLB and complementary bit lines BLA and/BLA that correspond to the B port are wired. The word line WLA is coupled to gate terminals of the transfer gates M5 and M7. When the word line WLA is activated, the memory nodes of the memory cell are electrically coupled to the bit lines BLA and/BLA. The word line WLB is coupled to gate terminals of the transfer gates M6 and M8. When the word line WLB is activated, the memory nodes of the memory cell are electrically coupled to the bit lines BLB and/BLB.

Figure 3:
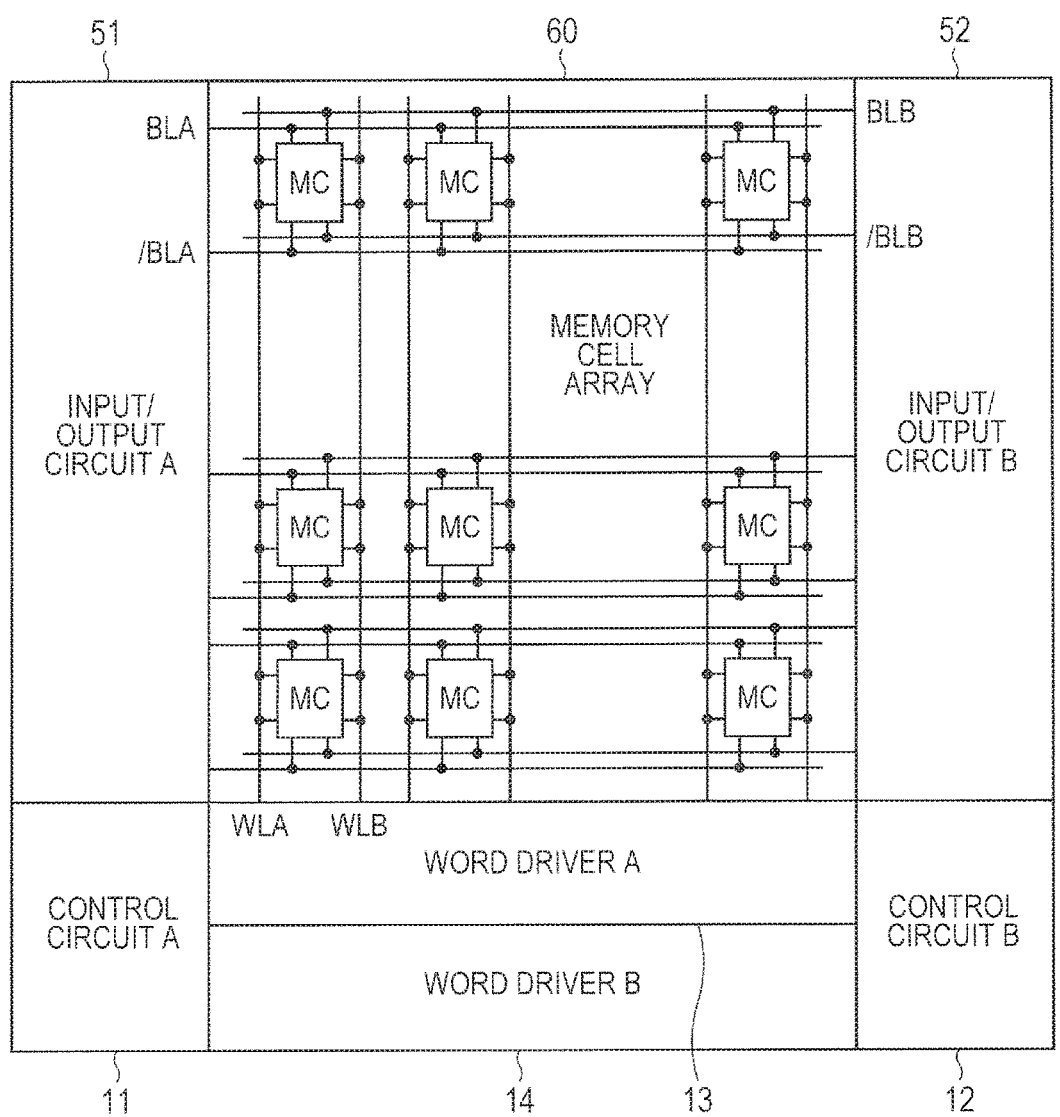
FIG. 3 is a schematic diagram illustrating one example of a whole configuration of the DP-SRAM that is one example of the multi-port memory.

FIG. 3 is a schematic diagram illustrating one example of a whole configuration of the DP-SRAM 100 that is one example of the multi-port memory. The DP-SRAM 100 includes the memory cell array 60, an input/output circuit A (51), a control circuit A (11) and a word driver A (13) that correspond to the A port and an input/output circuit B (52), a control circuit B (12) and a word driver B (14) that correspond to the B port. The input/output circuit A (51) and the input/output circuit B (52) are configurational examples of the input/output circuit 50 in FIG. 1, and the control circuit A (111) and the control circuit B (12), and the word river A (13) and the word driver B (14) are configurational examples of the address control circuit 10 in FIG. 1. The input/output circuit A (51) and the input/output circuit B (52) each includes a bit line drive circuit, a sense amplifier and a pre-charge circuit illustration of which is omitted and are respectively coupled to the bit lines BLA and/BLA and the bit lines BLB and/BLB. The word driver A (13) and the word driver B (14) are respectively coupled to the word line WLA and the word line WLB. The word lines WLB and MBL each is illustrated as one of the plurality of word lines (m lines in FIG. 1). The word driver A (13) and the word driver B (14) are respectively controlled by the control circuit A (11) and the control circuit B (12) and thereby each activates one of the plurality of word lines or the plurality of word lines that correspond (s) to each port. The control circuit A (11) and the control circuit B (12) control bit line pre-charging, bit line driving and/or sense amplifier start-up and so forth performed by the input/output circuit A (51) and the input/output circuit B (52) in parallel.

Figure 4:
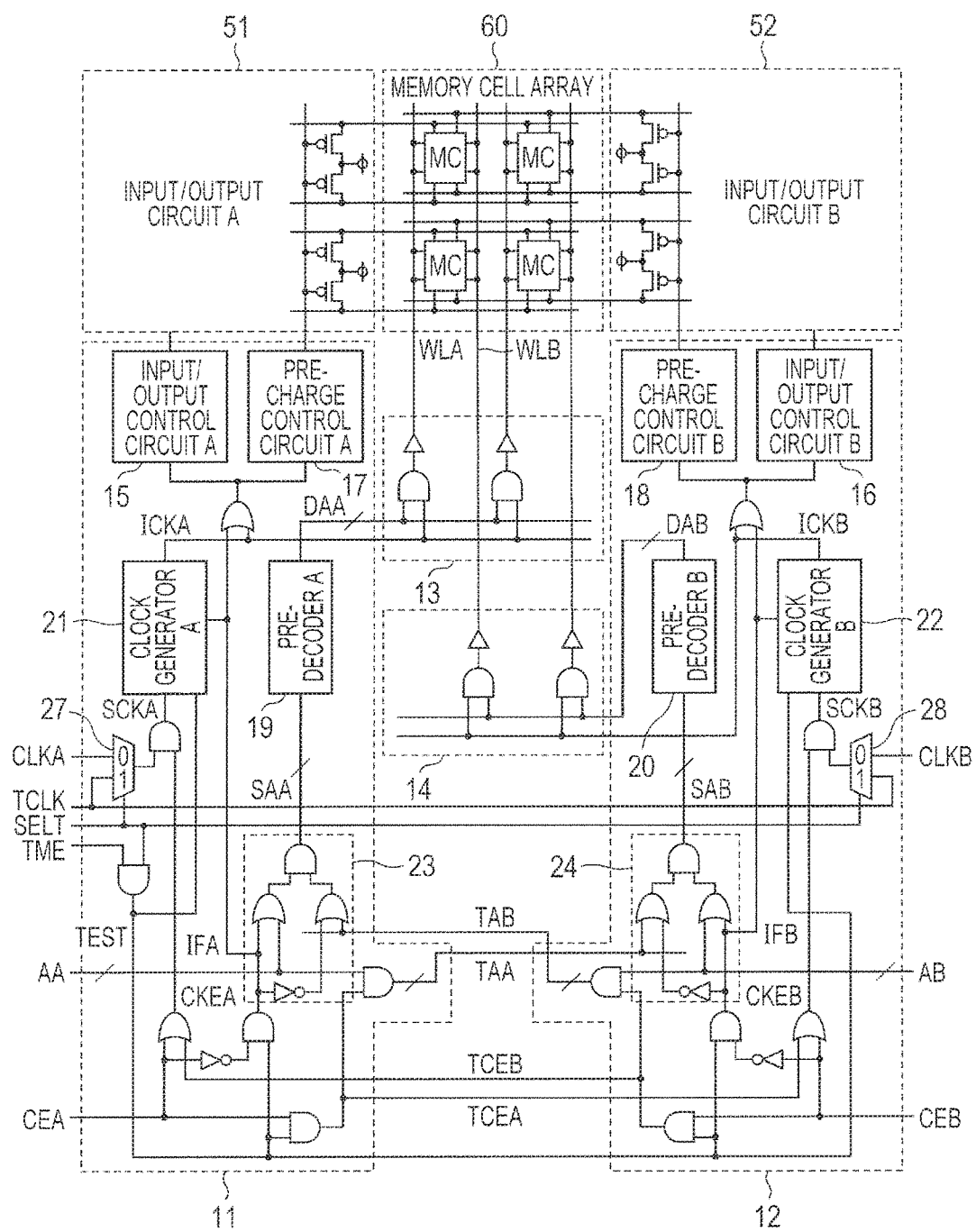
FIG. 4 is a configurational diagram illustrating one example of a DP-SRAM according to a second embodiment.

FIG. 4 is a configurational diagram illustrating one example of the DP-SRAM 100 according to the second embodiment. The DP-SRAM 100 includes the memory cell array 60, the input/output circuit A (51), the control circuit A (11) and the word driver A (13) that correspond to the A port, and the input/output circuit B (52), the control circuit B (12) and the word driver B (14) that correspond to the B port.

The A port side control circuit A (11) includes an input/output control circuit A (15), a pre-charge control circuit A (17), a pre-decoder A (19), a clock generator A (21), an address selection circuit A (23), a clock selection circuit A (27) and so forth, and an address signal AA, an A port enable signal CEA and an A port clock signal CLKA are input into the control circuit A (11). Further, a test enable signal TME is also input into the control circuit A (11). On the other hand, the B port side control circuit B (12) includes an input/output control circuit B (16), a pre-charge control circuit B (18), a pre-decoder B (20), a clock generator B (22), an address selection circuit B (24), a clock selection circuit B (28) and so forth, and an address signal AB, a B port enable signal CEB and a B port clock signal CLKB are input into the control circuit B (12). A test clock signal TCLK and a selection signal SELT are commonly input into the control circuit A (11) and the control circuit B (12) thereby to control the input/output circuit A (51) and the word driver A (13) on the A port side and the input/output circuit B (52) and the word driver B (14) on the B port side respectively.

Signals TAA and TCEA are supplied from the A port side control circuit A (11) to the B port side control circuit B (12) and signals TAB and TCEB are supplied from the B port side control circuit B (12) to the A port side control circuit A (11). The signals TAA and TAB are address signals that are delivered from the test side to the disturb side at the time of a disturb test, and the signals TCEA and TCEB are signals for activating a clock signal sent from the test side to the disturb side at the time of the disturb test.

The A port side address selection circuit A (23) regards one of the address signal AA of its own and the address signal TAB supplied from the B port side as a selected address signal SAA and supplies the signal SAA to the pre-decoder A (19). Likewise, the B port side address selection circuit B (24) regards one of the address signal AB of its own and the address signal TAA supplied from the A port side as a selected address signal SAB and supplies the signal SAB to the pre-decoder B (20). Decoding result signals DAA and DAB of the pre-decoder A (19) and the pre-decoder B (20) are respectively supplied to the word driver A (13) and the word driver B (14) and thereby corresponding word lines are activated.

An operation of the DP-SRAM 100 will be described by using FIG. 5 in addition to FIG. 4. A logic circuit illustrated in FIG. 4 is one example of a circuit for implementing functions listed on a true value table in FIG. 5 and may be optionally changed including the positive logic/the negative logic of signals.

FIG. 5 is an explanatory diagram of one example of the operation of the DP-SRAM 100 according to the second embodiment indicated in the form of the true value table.

When a selection signal SELT is "0", it indicates the normal operation mode and the clock signals CLKA and CLKB are respectively selected as operation clock signals for the respective ports by the clock selection circuits A (27) and B (28). When the selection signal SELT is "1", it indicates the test mode and the clock signal TCLK is selected by both of the clock selection circuits A (27) and B (28) as the operation clock signal that is common between the A and B ports. In the test mode (SELT="1"), when a test mode enable signal TME is "0", a normal memory test is performed, and when the signal TME is "1", a memory test in the disturbed state is performed.

In the normal operation mode (SELT="0"), the signals CEA and CEB function as port enable signals that act on the A port and the B port independently of each other, the port enable signal CEA makes the A port operate in synchronization with the clock signal CLKA in an asserted state ("1"), and the port enable signal CEB makes the B port operate in synchronization with the clock signal CLKB in the asserted state ("1"). Even in the test mode (SELT="1"), the signals CEA and CEB function as the port enable signals that act on the A port and the B port independently of each other in a normal memory test (TME="0"). However, the both ports operate in synchronization with a test clock signal TCLK. In the test mode (SELT="1") and further in a memory test performed in the disturbed state (TME="1"), the signals CEA and CEB function as signals for designating a test object port and a disturb port. Here, the test object port is a port that an access to the memory cell is actually made for the test, and the disturb port is a port that activates the word line that is coupled to the same memory cell as the above thereby to form the disturbed state. When CEA="1" and CEB="0", the A port functions as the test object port and the B port functions as the disturb port. Inversely, when CEA="0" and CEB="1", the B port functions as the test object port and the A port functions as the disturb port. When CEA="1" and CEB="1", it indicates an undisturbed operation and when CEA="0" and CEB="0", it indicates NOP (No Operation) that none of the ports is accessed.

The normal operation mode (SELT="0") will be described in more detail. Although only the operation of the A port will be described, the operation of the B port is same as that of the A port because the A port and the B port are operable asynchronously with each other and independently of each other. Since SELT="0", TEST="0". Here, TEST is a signal indicative of the disturb test mode, TEST "1" indicates the disturb test mode and TEST "0" indicates the normal test mode or the normal operation mode. When CEA="1" and the A port is controlled to an enable state, it results in CKEA="1". However, since TEST="0", TCEA="0". Here, CKEA is a signal for activating the clock signal, and when CKEA="1", the A port side clock signal is activated. TCEA is a signal for activating the clock signal sent from the test side to the disturb side in the disturb test mode. Although when TCEA="1", the clock signal activation signal TCEA activates the clock signal on the opposite-side B port, since TEST="0" and hence TCEA="0", no influence is imparted on the B port side. Since CKEA="1", the clock signal CLKA selected by the clock selection circuit A (27) is output as a clock selection signal SCKA and the clock selection signal SCKA is input into the clock generator A (21). An internal clock signal (ICKA) that defines rising of the clock selection signal SCKA as the origin is output from the clock generator A (21). A timing of the internal clock signal ICKA will be described later. The address signal AA of the A port itself is selected by the address selection circuit A (23) and is supplied to the pre-decoder A (19) as the address signal SAA. The word driver A (13) activates one word line corresponding to the address signal AA on the basis of the decoding result signal DAA that is output from the pre-decoder A (19). A timing that the word line is activated and operation timings of the input/output control circuit A (15) and the pre-charge control circuit A (17) are defined using the internal clock signal ICKA. When data reading, the pre-charge control circuit A (17) operates and thereby the bit line concerned is pre-charged and the word line corresponding to the address signal AA is activated. The input/output control circuit A (15) operates and thereby a sense amplifier (not illustrated) in the input/output circuit A (51) operates and data is read out of the memory cell that has been selected by the activated word line. When data writing, the word line corresponding to the address signal AA is activated and the input/output control circuit A (15) operates, and thereby a bit line drive circuit (not illustrated) in the input/output circuit A (51) drives the bit line concerned and data is written into the memory cell that has been selected by the activated word line.

The normal memory test mode (SELT="1", TME="0") using the test clock signal TCLK will be described. Since SELT="1", the test clock signal TCLK that has been selected by the clock selection circuit A (27) and the clock selection circuit B (28) is output as the clock selection signals SCKA and SCKB and the clock selection signals SCKA and SCKB are input into the clock generator A (21) and the clock generator B (22). Thereby, the DP-SRAM 100 operates in synchronization with the test clock signal TCLK. Since other operations are the same as those in the above-mentioned normal operation mode, description thereof is omitted.

The disturb test mode (SELT="1", TME="1") will be described.

When CEA="1" and CEB="0", the A port functions as the test object port and the B port functions as the disturb port.

On the A port side, CKEA="1" and the test clock signal TCLK is selected and output as the clock selection signal SCKA and then the clock selection signal SCKA is supplied to the clock generator A (21). In addition, IFA="0" and the address signal AA is selected and output as the address signal SAA and the address signal SAA is supplied to the pre-decoder A (19). The word line that corresponds to the address signal AA that has been selected with the decoding result signal DAA by the pre-decoder A (19) is activated in synchronization with the internal clock signal ICKA that is output from the clock generator A (21) and the input/output control circuit A (15) and the pre-charge control circuit A (17) operate in synchronization with the internal clock signal ICKA, and thereby data reading or data writing on the A port side is executed. In addition, since TCEA="1", the address signal AA on the A port side is transmitted as the address signal TAA concurrently with a memory access operation on the A port side.

On the B port side, since CEB="0", IFB="1" and the address selection circuit B (24) selects the address signal TAA that has been transmitted from the A port side, that is, the address signal AA on the A port side in place of the address signal AB on the B port side and outputs the address signal AA as the selection signal SAB and the selection signal SAB is supplied to the pre-decoder B (20). Accordingly, also on the B port side, the word line that corresponds to the address signal AA that is the same as that on the A port side is selected by the pre-decoder B (20) and the word line so selected is activated by the word driver B (14). In addition, although the enable signal CEB on the B port side is "0" (CEB="0"), the clock activation signal TCEA supplied from the A port side is "1" (TCEA="1") and therefore CKEB="1" and the clock signal TCLK is selected as the B port clock selection signal SCKB and the clock selection signal SCKB is supplied to the clock generator B (22). The clock generator B (22) generates and outputs a B port internal clock signal ICKB that synchronizes with the clock signal TCLK. Although the word driver B (14) operates in synchronization with the internal clock signal ICKB, IFB="1" and therefore the internal clock signal ICKB is not transmitted to the pre-charge control circuit B (18) and the input/output control circuit B (16). In the input/output circuit B (52), pre-charging of the bit line is not cleared and neither data reading nor data writing are executed on the B port side.

When CEA="0" and CEB="1", the B port functions as the test object port and the A port functions as the disturb port inversely and operate in the same manner as the above. Description thereof is omitted.

When CEA="0" and CEB="0", TCEA="0" and TCEB="0", and CKEA="0" and CKEB="0", and therefore both of the clock selection signals SCKA and SCKB are fixed to "0s" and neither the clock generator A (21) nor the clock generator B (22) operate. Neither the A port nor the B port operate and the NOP state is established.

When CEA="1" and CEB="1", it indicates an undisturbed operation. Since IFA="0" and IFB="0", the address signal AA is transmitted as the address signal SAA and the address signal AB is transmitted as the address signal SAB. When the address signal AA is different from the address signal AB, since the word lines that are coupled to the memory cells that are different between the A port and the B port are activated, the disturbed state is not established. In addition, even though the address signal AA is the same as the address signal AB and the word lines that are coupled to the same memory cell are activated, when timings for activation of the word lines are not appropriately adjusted, it is difficult to perform the appropriate disturb test. In general, since the timings that the word lines are activated deviate from each other due to a clock skew between the ports, it is difficult to perform the appropriate disturb test.

The clock generators A (21) and B (22) will be described. It is possible to configure the clock generators A (21) and B (22) by adopting the well-known circuit configurations disclosed, for example, in Japanese Unexamined Patent Application Publication No. 2010-80001 and Yuichiro Ishii, et al, "A 28 nm Dual-Port SRAM Macro With Screening Circuitry Against Write-Read Disturb Failure Issues", IEEE J. Solid-State Circuits, U.S.A., Institute of Electrical and Electronics Engineers, November 2011, Vol. 46, No. 11, pp. 2535-2544.

Figure 6:
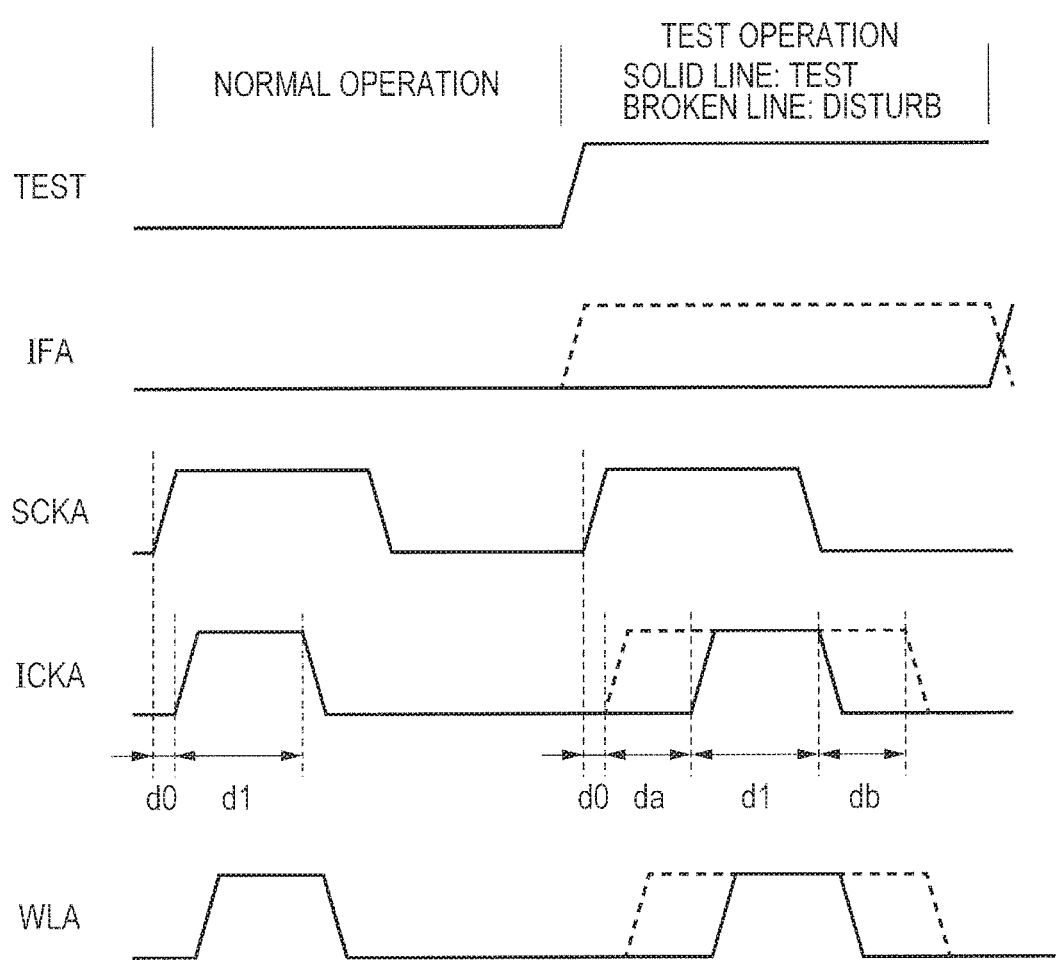
FIG. 6 is a timing chart illustrating one example of an operation of a clock generator.

FIG. 6 is a timing chart illustrating one example of an operation of the clock generator. Although FIG. 6 illustrates one example of the waveforms of the clock generator A (21), the same is true of the clock generator B (22). The waveform corresponding to one cycle of the selected clock signal SCK is illustrated for each of a period of the normal operation mode and a period of the test operation mode.

In the period of the normal operation, TEST=a low ("0") level and IFA=a low ("0") level, after a signal propagation path has been delayed by a delay d0 from rising of the clock selection signal SCKA, the word line activation pulse ICKA rises and then falls after the pulse has traveled by a pulse width d1. In accordance with this operation, that is, after signal propagation has been delayed by the word driver A (13), the word line WLA is activated. The pulse width d1 is generated in the clock generator A (21) so as to have a value with which it becomes possible to appropriately perform data reading and data writing.

In regard to the period of the test operation mode, the waveform when the A port functions as the test object is indicated by a solid line and the waveform when the A port functions as the disturb side is indicated by a broken line. TEST=a high ("1") level in the period of the test operation mode, when the A port is on the test side, IFA=the low ("0") level, while when the A port is on the disturb side, IFA=the high ("1") level.

When the A port is on the test side and IFA=the low ("0") level, the word line activation signal ICKA rises by being delayed by da behind a delay d0 of the signal propagation path after rising of the clock selection signal SCKA and then falls after having been propagated by the pulse width d1 that is the same as that in the normal operation mode. On the other hand, when the A port is on the disturb side and IFA=the high ("1") level, the word line activation signal ICKA rises by being delayed by the delay d0 of the signal propagation path after rising of the signal clock selection SCKA and then falls after having been propagated by a pulse width corresponding to delays da+d1+db. Here, the delays da and db are generated in the clock generator A (21).

As described above, it is possible to perform the disturb test of the A port by setting the A port as the test object and setting the B port as the disturb side. It becomes possible to surely make the word driver on the disturb side port perform a disturb operation by setting the delays da and db to values that are larger than the value of the clock skew between the ports. However, it is feared that a too large delay amount may induce so-called overkill because of occurrence of an excessive disturbance. For example, when reversal of the bit line level is obstructed by a disturbance of a pulse width that is considerably larger than the normal pulse width d1 in the data writing operation, the excessive disturbance occurs. It is requested to appropriately define or adjust the delays da and db so as to avoid occurrence of such an excessive disturbance that would not occur in the normal operation mode.

As described above, the address selection circuit that selects as to which address is used in the address of its own port and the address of the mating port for driving the word line is installed in each of the two ports and the address used in testing is delivered from the test side port to the disturb side port so as to control only the test side port, and thereby it becomes possible to make the disturb side port perform the disturb operation. In addition, the clock generator that controls the timing that the word line is activated is installed in each of the ports and the word line on the disturb side is controlled such that the signal rises surely earlier and falls surely later than the period that the word line on the test side is being activated, and thereby the clock skew between the ports is absorbed and it becomes possible to perform the appropriate disturb test. Further, the port enable signals CEA and CEB that are used in the normal operation mode are used in order to designate whether each port operates as the test side port or the disturb side port, and thereby it is not requested to add a control signal exclusive for disturb test and a terminal used for the control signal.

In many cases, in the multi-port cells represented by the DP-SRAMs, the respective ports are coupled to mutually different access subjects such as the CPUs and so forth and are accessed from the respective access subjects independently of one another and asynchronously with one another. Accordingly, in order to perform the disturb test on the multi-port memory, it has been conventionally requested to install an exclusive use test circuit such as an MBIST (Memory Built In Self Test) and so forth. In order to perform the disturb test, it is requested to operate the access subjects that are coupled to the plurality of ports in cooperation with one another in order to mutually synchronize the accesses from the plurality of ports. However, it is practically difficult to operate the plurality of CPUs that are coupled to the mutually different ports cooperatively, because, in particular, it is not generally allowed to add such a cooperation function just for testing.

It is favorable that the address selection circuit and the clock generator be mounted in the memory macro-cell of the DP-SRAM 100. It becomes possible to more reduce the chip area than a case where, for example, the address selection circuit and the clock generator are mounted outside the memory macro-cell by automatic placement and wiring using the standard cells and so forth as a function of the MBIST. Further, since placement and wiring of the circuits are settled when designing the layout of the macro-cell, designing for delay is facilitated and it is not requested to take a large timing margin.

Third Embodiment

Figure 7:
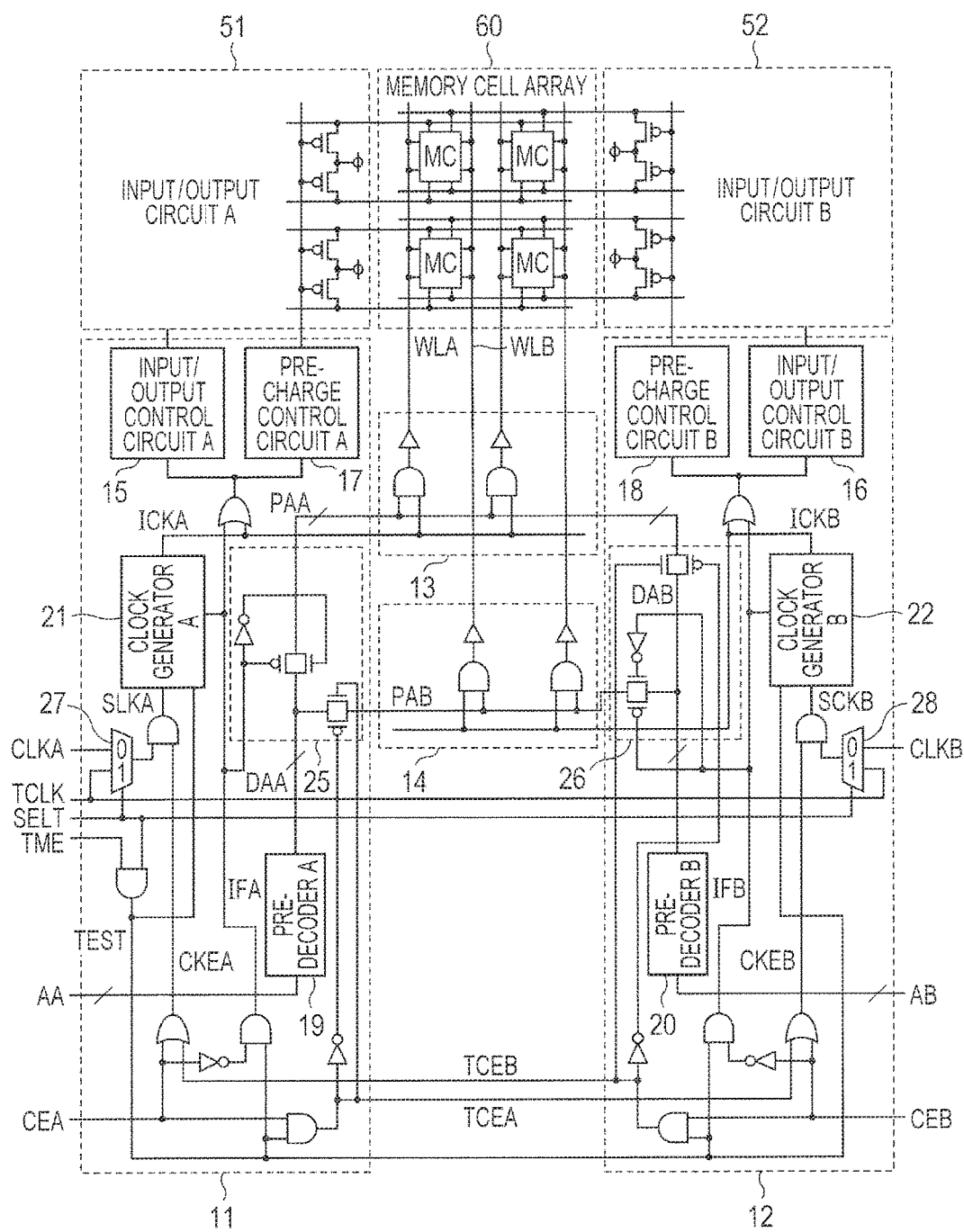
FIG. 7 is a configurational diagram illustrating one example of a DP-SRAM according to a third embodiment.

FIG. 7 is a configurational diagram illustrating one example of a DP-SRAM 100 according to the third embodiment. Address decode signal selection circuits A (25) and B (26) are included in place of the address selection circuits A (23) and B (24) in the DP-SRAM 100 according to the second embodiment illustrated in FIG. 4. When the decoding result signal DAA of the its own side pre-decoder A (19) is supplied to the word driver A (13), the address decode signal selection circuit A (25) outputs the decoding result signal DAA as an input signal PAA, while when the decoding result signal DAA is supplied to the other-side word driver B (14), the address decode signal selection circuit A (25) outputs the decoding result signal DAA as an input signal PAB. Likewise, when the decoding result signal DAB of its own side pre-decoder B (20) is supplied to the word driver B (14), the address decode signal selection circuit B (26) outputs the decoding result signal DAB as the input signal PAB, while when the decoding result signal DAB is supplied to the other-side word driver A (13), the address decode signal selection circuit B (26) outputs the decoding result signal DAB as the input signal PAA. When the decoding result signals are mutually input from their mating ports, the signals that are output from their own sides as the input signals PAA and PAB are controlled so as to have high impedances. Since other configurations and operations are the same as those in the second embodiment, description thereof is omitted.

Thereby, it becomes possible to deliver the decoding result signals DAA and DAB of the pre-decoders to the word drivers A (13) and B (14) respectively as the input signals PAA and PAB in place of mutually delivering the address signals TAA and TAB.

FIG. 8 is an explanatory diagram of one example of an operation of the DP SRAM 100 according to the third embodiment indicated in the form of a true value table. Also, in the true value table in FIG. 8, the column "ADDRESS SELECTION" in the true value table that indicates the operation of the DP-SRAM according to the second embodiment illustrated in FIG. 5 is replaced with "PRE-DECODE SIGNAL SELECTION". The DP-SRAM operates in the same manner as the DP-SRAM according to the second embodiment except that the pre-decoding result is adopted as an intermediate value in place of the address, coping with a change in the above-mentioned circuit configuration.

Also in the third embodiment, the same advantageous effects as those of the above-mentioned second embodiment are exhibited.

Fourth Embodiment

Figure 9:
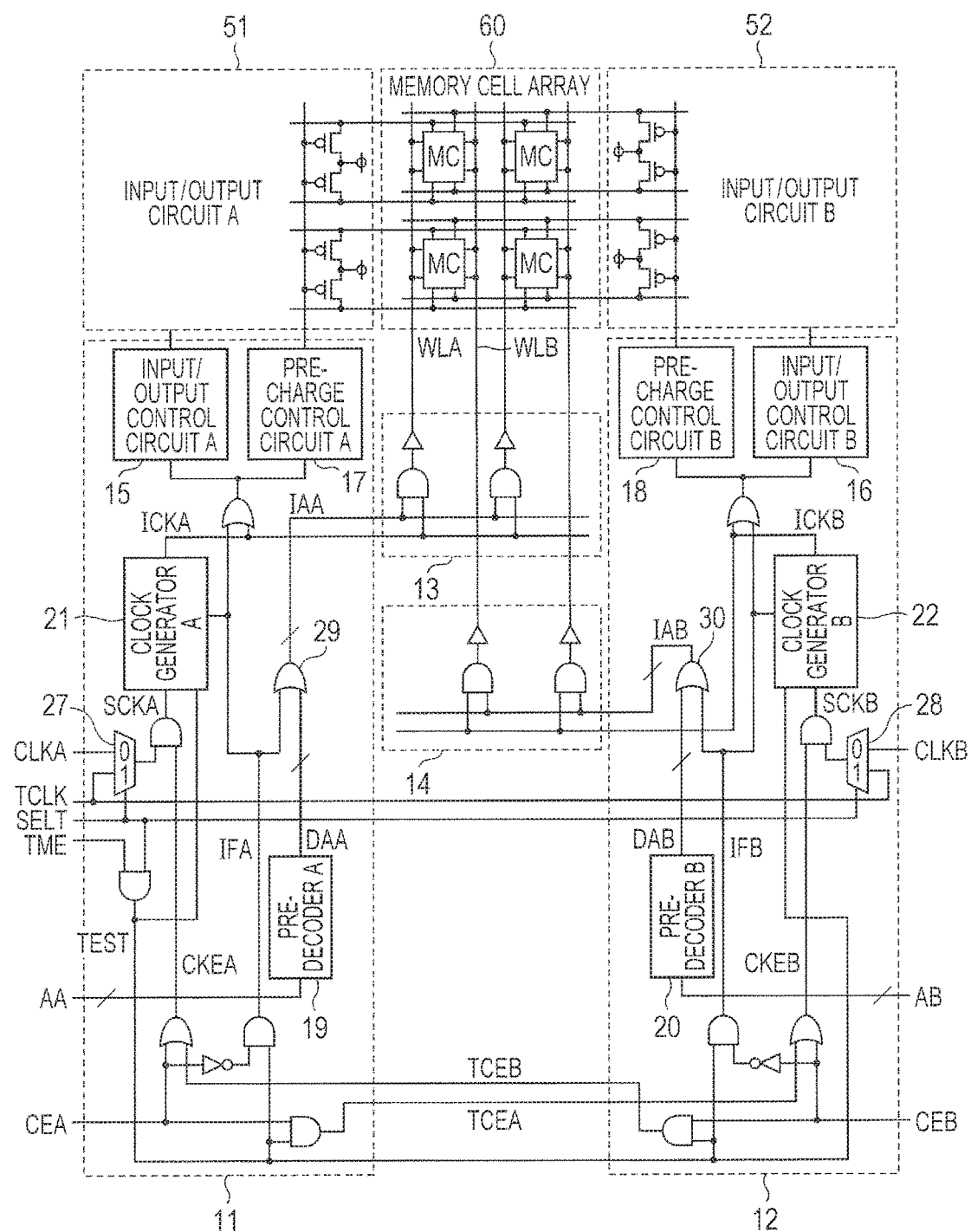
FIG. 9 is a configurational diagram illustrating one example of a DP-SRAM according to a fourth embodiment.

FIG. 9 is a configurational diagram illustrating one example of a DP-SRAM according to the fourth embodiment. Assert compulsion circuits A (29) and B (30) are included, in place of the address selection circuits A (23) and B (24) in the DP-SRAM 100 according to the second embodiment illustrated in FIG. 4 and the address decode signal selection circuits A (25) and B (26) in the DP-SRAM 100 according to the third embodiment 3 illustrated in FIG. 7. The assert compulsion circuits A (29) and B (30) are logic circuits that OR the pre-decode result signals DAA and DAB respectively with the assert compulsion signals IFA and IFB bit by bit. When the assert compulsion signal IFA is asserted, all of the word lines on the A port side are activated regardless of the decoding result DAA and the assert compulsion signal IFA is caused to output from the word driver A (13). When the asset compulsion signal IFB is asserted, all of the word lines on the B port side are activated regardless of the decoding result DAB and the assert compulsion signal IFB is caused to output from the word driver B (14). Since other circuit configurations and operations are the same as those of the DP-SRAMs 100 according to the second and third embodiments, the description thereof is omitted.

Thereby, in regard to the word lines on the disturb side port, it is possible to activate not only the word line that is coupled to the memory cell as the test object but also all of the word lines on the disturb side port.

FIG. 10 is an explanatory diagram of one example of an operation of the DP-SRAM 100 according to the fourth embodiment indicated in the form of a true value table. The true value table in FIG. 10 is the same as the true value table that indicates the operation of the DP-SRAM according to the third embodiment illustrated in FIG. 8 except that in the disturb test (SELT="1" and TME="1"), all bits of the "PRE-DECODE SIGNAL SELECTION" signal of the port that has been set as the disturb side are compulsively set to "1s" because "0s" have been designated to the port enable signals CEA and CEB.

Thereby, the circuit scale of the address control circuits (10, 11, 12) is more reduced than that of the circuits in the second and third embodiments. The effect of circuit simplification is large, in particular, in a multi-port memory that is small in the number of word lines.

Incidentally, that the assert compulsion circuits A (29) and B (30) are "logic circuits that respectively OR the pre-decode result signals DAA and DAB with the assert compulsion signals IFA and IFB bit by bit" is a description when all of the assert compulsion signals IFA and IFB and signals IAA and IAB are positive logic signals. When one or both of these signals has/have been changed to the negative logic signal(s), the configuration of the logic circuit is appropriately changed accordingly.

Fifth Embodiment

Figure 11:
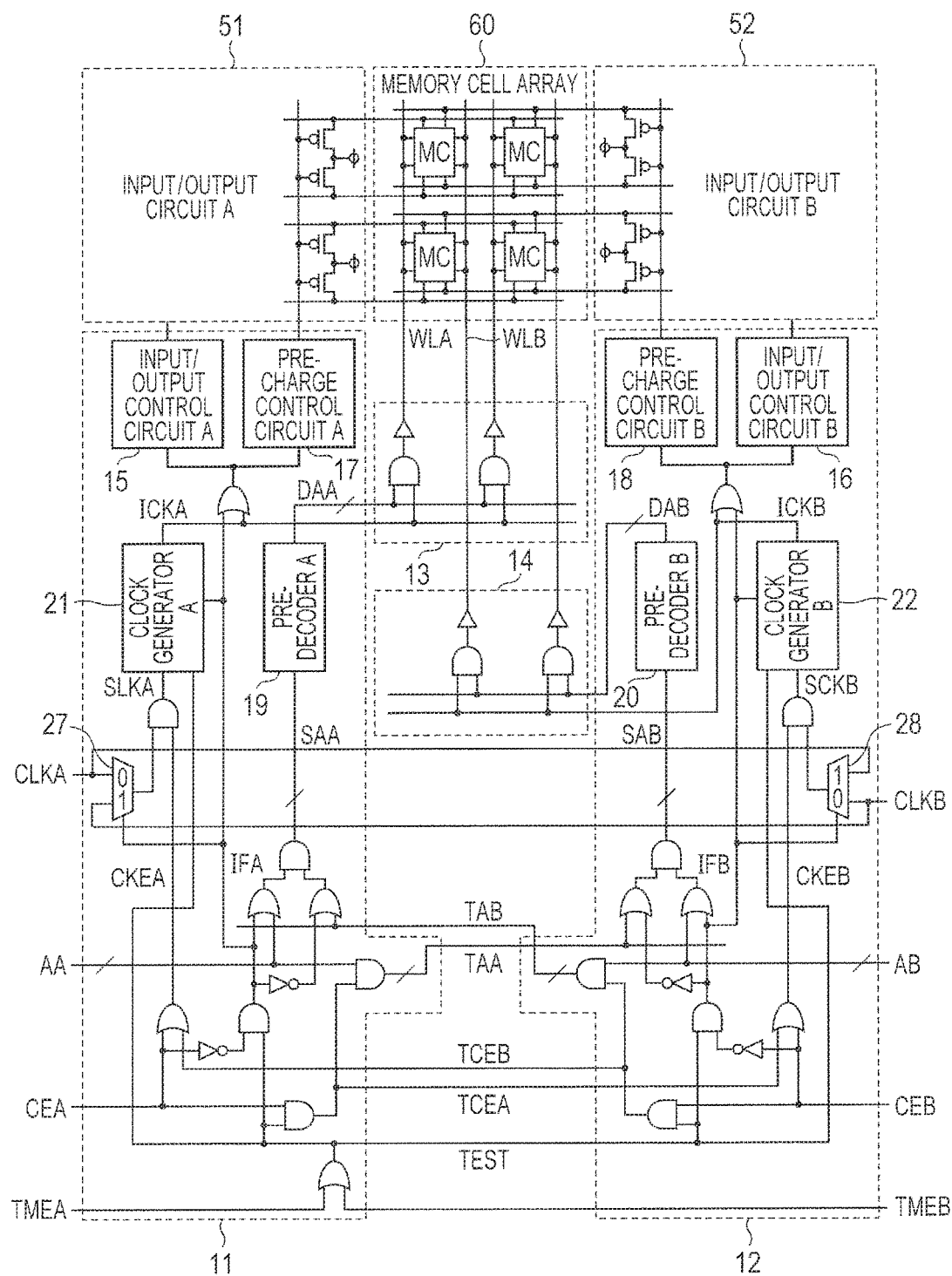
FIG. 11 is a configurational diagram illustrating one example of a DP-SRAM according to a fifth embodiment.

FIG. 11 is a configurational example illustrating one example of a DP-SRAM according to the fifth embodiment. In the DP-SRAM 100 according to the second embodiment illustrated in FIG. 4, selection of the clock signal is performed between the clock signals CLKA and CLKB of their own ports and the test clock signal TCLK respectively by the clock selection circuits A (27) and B (28). In contrast, in the fifth embodiment, the test clock signal TCLK is not used and the clock signals CLKA and TLKB are used similarly to signal selection in the normal operation mode. In the disturb test, the clock signal on the test side is delivered to the disturb side. The clock signals CLKA and CLKB are input into the clock selection circuit A (27) and one of the signals is selected using the assert compulsion signal IFA and is output. Likewise, the clock signals CLKA and CLKB are also input into the clock selection circuit B (28), and one of the signals is selected using the assert compulsion signal IFB and is output. Thereby, inputting of the test clock signal TCLK is eliminated. Further, in place of the test mode enable signal TME, test mode enable signals TMEA and TMEB are input port by port. Since other configurations and operations are the same as those in the second embodiment, description thereof is omitted.

FIG. 12 is an explanatory diagram of one example of an operation of the DP-SRAM according to the fifth embodiment indicated in the form of a true value table. The columns of SELT, TME and TCLK in the true value table that indicates the operation of the DP-SRAM according to the second embodiment illustrated in FIG. 5 are deleted and the columns of TMEA and TMEB are added instead. Although the operation that is the same as the operation in the disturb test in FIG. 5 is executed irrespective of which one of the test mode enable signals TMEA and TMEB is asserted, the signal CLKA or CLKB is used as the clock signal in place of the clock signal TCLK. In an un-disturb test that CEA="1" and CEB="1", the A port side operates in synchronization with the clock signal CLKA and the B port side operates in synchronization with the clock signal CLKB. When CEA="1" and CEB="0", the B port is the test side and the A port is the disturb side and therefore the clock signal CLKB on the test side is delivered to the disturb side A port and is used. Inversely, when CEA="0" and CEB="1", the A port is the test side and the B port is the disturb side and therefore the clock signal CLKA on the test side is delivered to the disturb side B port and is used. When CEA="0" and CEB="0", it indicates NOP. Since the normal operation mode is the same as that in the second embodiment, description thereof is omitted.

Figure 13:
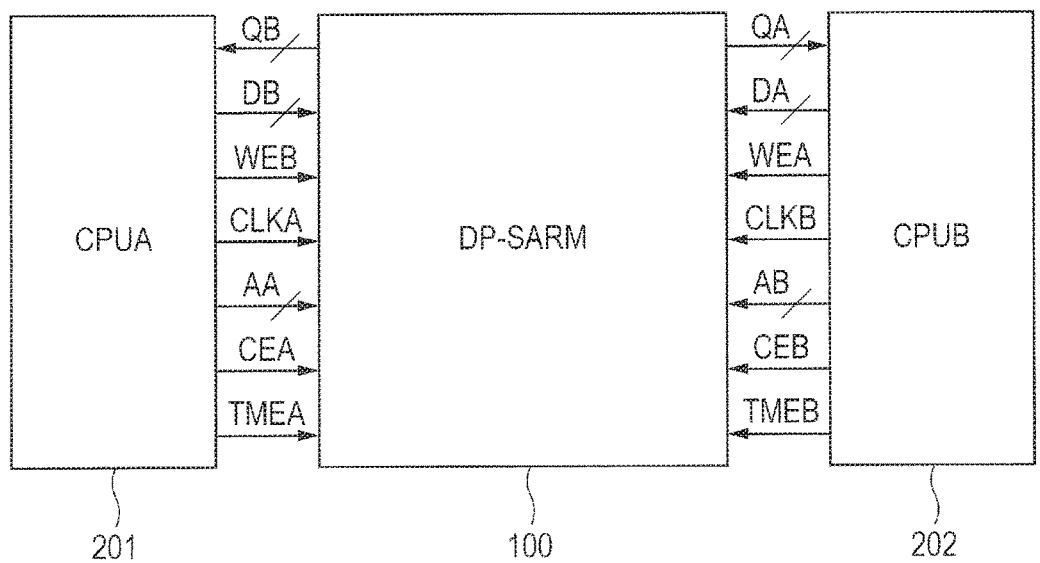
FIG. 13 is a schematic diagram illustrating one example of a system configuration that the DP-SRAM according to the fifth embodiment has been used.

FIG. 13 is a schematic diagram illustrating one example of a system configuration that the DP-SRAM according to the fifth embodiment has been used. A CPU A 201 is coupled to the A port of the DP-SRAM 100 and a CPU B 202 is coupled to the B port of the DP-SRAM 100. The CPU A 201 and the CPU B 202 are capable of accessing to the DP-SRAM 100 independently of each other and asynchronously with each other in the normal operation mode and capable of performing the memory test on the DP-SRAM 100 independently of each other and asynchronously with each other also in the test mode. In this case, when the post to which its own self is coupled has been set as the test object, it is possible to set the other port as the disturb port and it is possible to perform the disturb test by itself without cooperatively operating the plurality of CPUs. If requested, mutual communication may be performed such that only the port enable signals (CEA and CEB) sent from the disturb port side CPU are negated. Incidentally, as illustrated in FIG. 11, since the test mode enable signals TMEA and TMEB that have been input into the DP-SRAM 100 are simply ORed and the disturb test mode signal TEST is output, it may be changed such that one TEST signal is input in place of inputting the test mode enable signals TMEA and TMEB. However, it becomes possible to set the A port side and the B port side symmetrically by inputting the signal by dividing into the test mode enable signals TMEA and TMEB and therefore it is effective in the point that it becomes possible to shift to the test mode from either port.

The fifth embodiment features the point that the configuration has been changed so as not to use the test clock signal TCLK. Although the example of the configuration changed from that of the second embodiment has been illustrated in FIG. 11 and FIG. 12, it is also possible to provide new embodiments by changing the configurations of the other embodiments such as the third and fourth embodiments. Delivering of the address system and presence/absence of the test clock signal TCLK specification are mutually independent technical ideas and may be optionally combined with each other.

Sixth Embodiment

Figure 14:
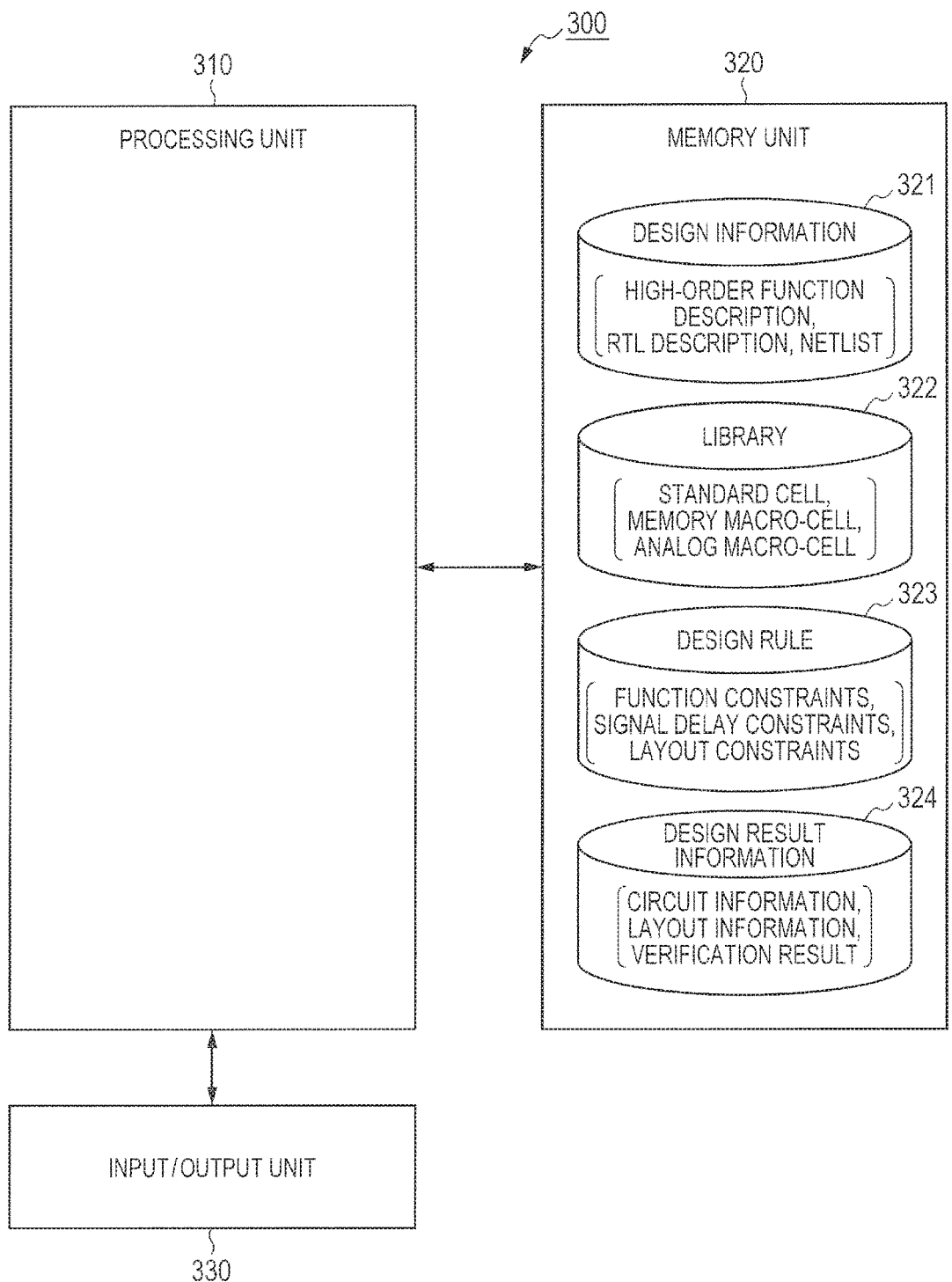
FIG. 14 is a block diagram illustrating one configurational example of an LSI design support system that utilizes the multi-port memory as a library.

FIG. 14 is a block diagram schematically illustrating one configurational example of an LSI design support system 300 that the multi-port memory 100 is utilized as a library.

The LSI design support system 300 includes a processing unit 310, a memory unit 320, an input/output unit 330 and so forth. For example, the LSI design support system 300 is implemented by a computer that includes a display, a keyboard, a mouse and so forth as the input/output unit 330, and includes storage media such as a hard disk and so forth as the memory unit 320, and the processing unit 310 is implemented as a processor that is loaded on the computer concerned. A netlist that higher-order function description, RTL (Register Transfer Level) description or gate-level circuit description has been made is stored in the memory unit 320 as design information 321. In addition, a library 322 that includes a standard cell library, a memory macro-dell library, an analog macro-cell library and so forth is stored in the memory unit 320 and further a design rule 323 that function constraints, signal delay constraints, layout constraints and so forth have been established is stored in the memory unit 320. It is possible for the processing unit 310 to execute logic synthesis, timing verification, layout design by automatic placement and wiring, and other various kinds of verifications on the design information 321 by executing a program stored in the memory unit 320 and to output a result of execution to the memory unit 320 as design result information 324. For example, circuit information, layout information and results of various kinds of verifications are output to and stored into the design result information 324. The input/output unit 330 functions as a user interface that an LSI designer who is a user uses in order to input the design information 321 on the occasion of processing of these pieces of information, or to input various kinds of design parameters in the course of processing these pieces of information, or to confirm the design result information 324.

The multi-port memory 100 that is represented by the DP-SRAM indicated in each embodiment of the present application is included into the library 322 as the memory macro-cell. A plurality of fixed memory macro-cells that various parameters are mutually varied may be included and the memory macro-cell may be generated by a RAM compiler that operates in the processing unit 310 and output to the memory unit 320. The memory macro-cell may be provided by a portable storage medium such as a DVD (Digital Versatile Disk) and so forth or a communication medium via the Internet so as to be incorporated into the LSI design support system 300 as the library.

Although in the foregoing, the invention that has been made by the inventors and others has been specifically described on the basis of the preferred embodiments of the present invention, it goes without saying that the present invention is not limited to the above-mentioned embodiments and may be altered and modified in a variety of ways within the range not deviating from the gist of the present invention.

For example, the configuration of the logic circuit that has been exemplified in each embodiment has been made on the assumption that the signals are the positive logic signals or the negative logic signals as described in the specification and it is possible to optionally change a relation between the positive logic and the negative logic.

What is claimed is:

1. A multi-port memory comprising:
   a memory cell array having a plurality of memory cells, a first memory cell included in the memory cell array, first and second word lines;
   first and second bit lines;
   first and second address terminals; and
   an address control circuit including first and second address decoders and first and second selectors,
   wherein the first selector is electrically coupled between the first address terminal and the first selector,
   wherein the second selector is electrically coupled between the second address terminal and the second selector,
   wherein the multi-port memory includes first and second operation modes,
   wherein the first word line is activated and thereby the first memory cell is electrically coupled to the first bit line,
   wherein the second word line is activated and thereby the first memory cell is electrically coupled to the second bit line,
   wherein in the first operation mode, a first address signal is input into the first address terminal and transmitted to the first address decoder via the first selector,
   wherein the address control circuit performs control based on the first address signal and an output signal from the first address decoder as to whether the first word line is activated,
   wherein a second address signal is input into the second address terminal and transmitted to the second address decoder via the second selector,
   wherein the address control circuit performs control based on the second address signal and an output signal from the second address decoder as to whether the second word line is activated,
   wherein in the second operation mode, the first address signal is input into the first address decoder via the first selector and input into the second address decoder via the second selector respectively, and
   wherein the address control circuit performs control as to whether the first word line and the second word line are activated based on the first address signal and output signals from the first and second address decoders.

2. The multi-port memory according to claim 1,
   wherein the address control circuit includes third and fourth selectors,
   wherein control as to whether the first word line is activated is performed based on an output signal from the third selector,
   wherein control as to whether the second word line is activated is performed based on an output signal from the fourth selector,
   wherein in the first operation mode, the third selector selects and outputs an output signal from the first address decoder, and the fourth selector selects and outputs an output signal from the second address decoder, and
   wherein in the second operation mode, both of the third and fourth selectors select and output the output signal from the first address decoder.

3. The multi-port memory according to claim 1,
   wherein the address control circuit includes first and second assert compulsion circuits configured such that the first assert compulsion circuit performs control as to whether an output signal from the first address decoder is compulsively asserted and the second assert compulsion circuit performs control as to whether an output signal from the second address decoder is compulsively asserted,
   wherein the first address signal is input into the first address decoder,
   wherein the second address signal is input into the second address decoder,
   wherein control as to whether the first word line is activated is performed based on an output signal from the first assert compulsion circuit,
   wherein control as to whether the second word line is activated is performed based on an output signal from the second assert compulsion circuit,
   wherein in the first operation mode, the first assert compulsion circuit outputs the output signal from the first address decoder, and the second assert compulsion circuit outputs the output signal from the second address decoder, and
   wherein in the second operation mode, the second assert compulsion circuit compulsively asserts and outputs the output signal from the second address decoder.

4. The multi-port memory according to claim 1, further comprising:
   first and second word drivers that drive the first and second word lines respectively;
   first and second clock generators;
   first and second clock selectors; and
   first, second and third clock terminals,
   wherein the first clock selector selects one clock signal from a first clock signal that is input through the first clock terminal and a third clock signal that is input through the third clock terminal and supplies the clock signal so selected to the first clock generator,
   wherein the second clock selector selects one clock signal from a second clock signal that is input through the second clock terminal and the third clock signal and supplies the clock signal so selected to the second clock generator,
   wherein the first clock generator supplies a first word line activation pulse that gives a timing that the first word line is activated to the first word driver,
   wherein the second clock generator supplies a second word line activation pulse that gives a timing that the second word line is activated to the second word driver,
   wherein in the first operation mode, the first clock selector selects and supplies the first clock signal to the first clock generator, and the second clock selector selects and supplies the second clock signal to the second clock generator,
   wherein in the second operation mode,
   the first clock selector selects and supplies the third clock signal to the first clock generator and the second clock selector selects and supplies the third clock signal to the second clock generator respectively, and the second clock generator generates the second word line activation pulse that gives the timing that the second word line is activated earlier than a timing that the first clock generator activates the first word line and that the second word line is deactivated later than a timing that the first clock generator deactivates the first word line and supplies the second word line activation pulse so generated to the second word driver.

5. The multi-port memory according to claim 4, wherein the multi-port memory is a dual-port memory and further comprises:

an operation mode control terminal; and
first and second port enable terminals,
wherein the multi-port memory is controlled based on an operation mode control signal that is input through the operation mode control terminal as to whether the multi-port memory operates in the first operation mode or in the second operation mode,
wherein when the multi-port memory operates in the first operation mode,
  the address control circuit performs control of the first word line that is based on the first address signal and the first clock selector selects and supplies the first clock signal to the first clock generator, on condition that a first port enable signal that is input through the first port enable terminal is asserted, and
  the address control circuit performs control of the second word line that is based on the second address signal and the second clock selector selects and supplies the second clock signal to the second clock generator, on condition that a second port enable signal that is input through the second port enable terminal is asserted, and
wherein when the multi-port memory operates in the second operation mode,
  the address control circuit performs control based on the first address signal as to whether the first word line and the second word line are activated, and the second clock generator generates a second word line activation pulse that gives a timing that the second word line is activated earlier than a timing that the first clock generator activates the first word line and that the second word line is deactivated later that a timing that the first clock generator deactivates the first word line and supplies the second word line activation pulse so generated to the second word driver, on condition that the first port enable signal that is input through the first port enable terminal is asserted and the second port enable signal that is input through the second port enable terminal is negated, and
  the address control circuit performs control based on the second address signal as to whether the first word line and the second word line are activated, and the first clock generator generates a first word line activation pulse that gives a timing that the first word line is activated earlier than a timing that the second clock generator activates the second word line and that the first word line is deactivated later than a timing that the second clock generator deactivates the second word line and supplies the first word line activation pulse so generated to the first word driver, on condition that the second port enable signal is asserted and the first port enable signal is negated.

6. The multi-port memory according to claim 1, further comprising:
first and second word drivers that respectively drive the first and second word lines;
first and second clock generators;
first and second clock selectors; and
first and second clock terminals,
wherein the first clock selector selects one clock signal from a first clock signal that is input through the first clock terminal and a second clock signal that is input through the second clock terminal and supplies the clock signal so selected to the first clock generator, and the second clock selector selects one clock signal from the first clock signal and the second clock signal and supplies the clock signal so selected to the second clock generator,
wherein the first clock generator supplies a first word line activation pulse that gives a timing that the first word line is activated to the first word driver,
  wherein the second clock generator supplies a second word line activation pulse that gives a timing that the second word line is activated to the second word driver,
wherein in the first operation mode, the first clock selector selects and supplies the first clock signal to the first clock generator, and the second clock selector selects and supplies the second clock signal to the second clock generator,
wherein in the second operation mode,
  the first and second clock selectors select and supply the first clock signal respectively to the first and second clock generators, and
  the second clock generator generates a second word line activation pulse that gives a timing that the second word line is activated earlier than a timing that the first clock generator activates the first word line and that the second word line is deactivated later than a timing that the first clock generator deactivates the first word line and supplies the second word line activation pulse so generated to the second word driver.

7. The multi-port memory according to claim 1, further comprising:
an operation mode control terminal; and
first and second port enable terminals,
wherein the multi-port memory is controlled based on an operation mode control signal that is input through the operation mode control terminal as to whether the multi-port memory operates in the first operation mode or to be operated in the second operation mode,
wherein when the multi-port memory operates in the first operation mode,
  the address control circuit performs control of the first word line that is based on the first address signal, on condition that a first enable signal that is input through the first port enable terminal is asserted, and
  the address control circuit performs control of the second word line that is based on the second address signal, on condition that a second port enable signal that is input through the second port enable terminal is asserted,
wherein when the multi-port memory operates in the second operation mode,
  the address control circuit activates the first word line and the second word line based on the first address signal, on condition that the first port enable signal that is input through the first port enable terminal is asserted and the second port enable signal that is input through the second port enable terminal is negated, and the address control circuit activates the first word line and the second word line based on the second address signal, on condition that the second port enable signal is asserted and the first port enable signal is negated.

8. A semiconductor device comprising:

the multi-port memory according to claim 1, wherein the multi-port memory is mounted on a single semiconductor substrate.

9. A semiconductor device comprising:

the multi-port memory according to claim 7; and first and second central processing units, wherein the multi-port memory and the first and second central processing units are mounted on a single semiconductor substrate, wherein a first address signal, a first clock signal and a first port enable signal are respectively supplied from the first central processing unit to the first address terminal, the first clock terminal, and the first port enable terminal of the multi-port memory, and wherein a second address signal, a second clock signal, and a second port enable signal are respectively supplied from the second central processing unit to the second address terminal, the second clock terminal and the second port enable terminal of the multi-port memory.

* * * * *